(12) United States Patent
Verbeeck et al.

(10) Patent No.: US 11,062,872 B2
(45) Date of Patent: Jul. 13, 2021

(54) SPATIAL PHASE MANIPULATION OF CHARGED PARTICLE BEAM

(71) Applicant: UNIVERSITEIT ANTWERPEN, Antwerp (BE)

(72) Inventors: Johan Verbeeck, Hever (BE); Armand Béché, Grez-Doiceau (BE)

(73) Assignee: UNIVERSITEIT ANTWERPEN, Antwerp (BE)

( * ) Notice: Subject to any disclaimer, the term of this patent is extended or adjusted under 35 U.S.C. 154(b) by 0 days.

(21) Appl. No.: 16/755,941

(22) PCT Filed: Oct. 16, 2018

(86) PCT No.: PCT/EP2018/078218
§ 371 (c)(1),
(2) Date: Apr. 14, 2020

(87) PCT Pub. No.: WO2019/076884
PCT Pub. Date: Apr. 25, 2019

(65) Prior Publication Data
US 2020/0258712 A1    Aug. 13, 2020

(30) Foreign Application Priority Data
Oct. 17, 2017   (EP) .................... 17196951

(51) Int. Cl.
*H01J 37/04* (2006.01)
*H01J 37/28* (2006.01)

(52) U.S. Cl.
CPC .............. *H01J 37/04* (2013.01); *H01J 37/28* (2013.01); *H01J 2237/2614* (2013.01)

(58) Field of Classification Search
CPC .......... H01J 37/00; H01J 37/02; H01J 37/023; H01J 37/04
(Continued)

(56) References Cited

U.S. PATENT DOCUMENTS

| 5,814,815 A | 9/1998 | Matsumoto et al. |
| 5,834,769 A | 11/1998 | Fujita et al. |

(Continued)

FOREIGN PATENT DOCUMENTS

| WO | 2012165955 A2 | 6/2012 |
| WO | 2013092762 A1 | 6/2013 |
| WO | 2013092764 A  | 6/2013 |

OTHER PUBLICATIONS

Ito et al., "Electron Diffraction from Gratings Fabricated by Electron Beam Nanolithography," Ultramicroscopy, vol. 52, No. 3-4, Jan. 7, 1993, pp. 347-352.

(Continued)

*Primary Examiner* — Jason L McCormack
(74) *Attorney, Agent, or Firm* — Workman Nydegger (57) ABSTRACT

A device for locally manipulating a spatial phase distribution of a charged particle wave propagating along a beam axis comprises a support element having a target region for receiving the charged particle wave propagating along the beam axis and a plurality of phase adjusting elements, supported by the support element and located in the target region, for locally adjusting the phase of the charged particle wave when the charged particle wave impinges on the phase adjusting element. The device also comprises a plurality of control lines connected to the plurality of phase adjusting elements for individually controlling each phase adjusting element.

19 Claims, 7 Drawing Sheets

(58) Field of Classification Search
USPC .......................................... 250/306, 307, 311
See application file for complete search history.

(56) References Cited

U.S. PATENT DOCUMENTS

| | | | |
|---|---|---|---|
| 7,851,757 B2 | 12/2010 | Nagayama | |
| 8,071,954 B2 | 12/2011 | Wagner et al. | |
| 2005/0253082 A1* | 11/2005 | Ono | H01J 9/14 |
| | | | 250/396 R |
| 2008/0202918 A1 | 8/2008 | Nagayama et al. | |
| 2013/0193322 A1* | 8/2013 | Blackburn | G21K 5/02 |
| | | | 250/311 |
| 2014/0021655 A1 | 1/2014 | Hirata et al. | |
| 2014/0197325 A1* | 7/2014 | Kato | H01J 37/3177 |
| | | | 250/396 R |
| 2014/0224988 A1* | 8/2014 | Tamaki | H01J 37/295 |
| | | | 250/311 |

OTHER PUBLICATIONS

Ito et al., "Demonstration of Arrays of Sub-Micrometer Solid-State Fresnel Lenses for Electrons," Materials Research Society, vol. 636, at least as early as Jul. 1, 2001, pp. D5.7.1-D5.7.6.

Guzzinati et al., "Prospects for Versatile Phase Manipulation in the TEM: Beyond Aberration Correction," Ultramicroscopy, Apr. 30, 2015, 10 Pages.

Grillo et al., "Towards a Holographic Approach to Spherical Aberration Correction in Scanning Transmission Electron Microscopy," Optics Express, vol. 25, No. 18, Sep. 4, 2017, 5 Pages.

Extended European Search Report from corresponding EP Application No. 17196951.2, dated Apr. 26, 2018.

International Search Report and Written Opinion from PCT Application No. PCT/EP2018/078218, dated Feb. 19, 2019.

Carroll, "Pattern Generators for Reflective Electron-Beam Lithography (REBL)," Advances in Imaging and Electron Physics, vol. 188, Jan. 1, 2015, pp. 1-23.

Office Action from corresponding European Application No. 18785631.5, dated May 26, 2021.

\* cited by examiner

SPATIAL PHASE MANIPULATION OF CHARGED PARTICLE BEAM

FIELD OF THE INVENTION

The invention relates to the field of charged particle beam manipulation. More specifically it relates to methods and devices for locally manipulating a spatial phase distribution of a charged particle beam, e.g. an electron beam or ion beam.

BACKGROUND OF THE INVENTION

Beams of charged particles, such as electrons, are used in, for example, microscopy and lithography applications. For example, in scanning electron microscopy (SEM) and transmission electron microscopy (TEM), the structure and bonding in materials can be studied in exceptional details, e.g. even down to the atomic scale.

It is known to use phase modulation of an electron beam in electron microscopy to shape the beam such as to have advantageous beam properties. For example, phase manipulating elements, generally referred to as phase plates, may be placed in an electron beam in an electron microscope, e.g. in the back focal plane of the objective lens of such electron microscope, for imaging weak phase objects, such as biological samples. Phase modulation of charged particle beams can furthermore also be useful in other applications, such as charged beam lithography and charged particle accelerators.

Examples of such phase manipulating elements known in the art include Zernike elements (see e.g. U.S. Pat. No. 8,071,954), for example comprising a thin amorphous carbon film having small hole defined therein, Boersch elements (see e.g. U.S. Pat. No. 5,814,815), which may apply an electrostatic potential inside a microstructured electrode, and/or a magnetic element (see e.g. U.S. Pat. No. 7,851,757), for example comprising a magnetic or magnetized material that influences the beam phase. As another example, US 2008/202918 discloses a phase plate comprising a conductive core phase plate. A conductive shield thin film covers the periphery of the core phase plate.

However, phase manipulation is not limited to the imaging of weak phase objects. It is also known in the art to create charged particle vortices by imparting an orbital angular momentum to a charged particle wave. Such vortex waves may be used in applications such as quantum information and nano-manipulation. Since charged particles carry a magnetic moment, the combination of an orbital angular momentum and a magnetic moment may enable the user to probe a magnetic state of the material under study, e.g. enabling atomic resolution magnetic mapping of materials. For example, in the international patent applications WO 2013/092762 and WO 2013/092764, devices for such purpose are disclosed.

In accordance with WO 2013/092762, the device comprises a support element having a target region for transmitting the charged particle wave propagating along a beam axis and an induction means for inducing a magnetic flux along an elongated profile having a free end portion located in the target region. The induction means provides a magnetic flux in the elongated profile to induce an angular gradient, relative to the beam axis, of the phase of the charged particle wave when transmitted through the target region.

In accordance with WO 2013/092764, the device comprises a first conductive element comprising a plurality of angularly spaced electrical conductors arranged around the axis and a second conductive element spaced apart from the first conductive element along the direction of the axis. The first and second conductive elements are adapted for transmitting a charged particle wave propagating along the axis. A connecting means supplies an electrical potential difference over the first conductive element and the second conductive element. The connecting means is adapted for supplying an electrical potential to the plurality of angularly spaced electrical conductors for inducing an angular gradient of the phase of the charged particle wave when transmitted along the axis, in which the projection along the axis of the electrical potential varies as function of an angular position with respect to the axis.

SUMMARY OF THE INVENTION

It is an object of embodiments of the present invention to provide programmable, versatile, good and/or efficient means and methods for configuring a spatial phase distribution of a charged particle wave, e.g. in an electron microscopy apparatus, electron or ion lithography apparatus or similar apparatus that uses charged particle beams, e.g. particle accelerators.

The above objective is accomplished by a method and device according to the present invention.

It is an advantage of embodiments of the present invention that the phase of a charged particle wave can be dynamically programmed, e.g. freely configured within design constraints, e.g. to implement a weak phase imaging beam, a vortex wave, a non-diffracting beam in free space, such as a vortex wave, a Bessel beam, an Airy beam, a pi-beam, a helicon and/or a snake beam, and/or a converging or diverging beam.

It is an advantage of embodiments of the present invention that a programmable charged particle lens, e.g. a programmable electron lens, can be implemented by such embodiments.

It is an advantage of embodiments of the present invention that a good resolution and/or speed can be achieved in charged particle lithography, e.g. electron or ion lithography.

It is an advantage of embodiments of the present invention that an aberration can be corrected by such embodiments, e.g. in a charged particle beam lens.

It is an advantage of embodiments of the present invention that a good contrast in electron microscopy can be provided by such embodiments.

It is an advantage of embodiments of the present invention that beam damage can be reduced in electron microscopy, e.g. in TEM, e.g. relative to an apparatus using conventional lenses, aberration correctors and/or phase plates.

It is an advantage of embodiments of the present invention that resolution can be improved in electron microscopy, e.g. relative to an apparatus using conventional lenses, aberration correctors and/or phase plates.

It is an advantage of embodiments of the present invention that a simple, cheap and/or small alternative to a conventional charged particle apparatus can be achieved, e.g. by replacing costly, bulky and/or complex lenses and/or phase plates by embodiments in accordance with the present invention.

It is an advantage of embodiments of the present invention that hysteresis effects in conventional charged particle lenses can be easily compensated by a device in accordance with embodiments.

It is an advantage of embodiments of the present invention that hysteresis effects in conventional charged particle lenses can be removed by replacing such charged particle lens by a dynamically programmable device in accordance with embodiments.

It is an advantage of embodiments of the present invention that quantum information experiments and/or applications can be enabled.

It is an advantage of embodiments of the present invention that free electron communication can be carried out over a free electron carrier wave dynamically modulated by a device in accordance with embodiments.

It is an advantage of embodiments of the present invention that a programmable spatial phase distribution of a charged particle wave can be used to obtain material property measurements of a material interacting with the charged particle wave, such as, for example, magnetic properties, chirality and/or strain.

In a first aspect, the present invention relates to a device for locally manipulating a spatial phase distribution of a charged particle wave propagating along a beam axis. The device comprises a support element having a target region for receiving, e.g. transmitting and/or reflecting, the charged particle wave propagating along the beam axis. The device comprises a plurality of phase adjusting elements, supported by the support element and located in the target region, for locally adjusting the phase of the charged particle wave when the charged particle wave impinges on, e.g. is transmitted through (or near) or is reflected by, the phase adjusting element. The device comprises a plurality of control lines connected to the plurality of phase adjusting elements for individually controlling each phase adjusting element. The plurality of phase adjusting elements may be organized in a two-dimensional array.

In a device in accordance with embodiments of the present invention, each phase adjusting element may be directly connected to a corresponding control line for connecting the phase adjusting element directly to a controller. The controller may be integrated in the device, or may be connected to the device, e.g. via a connector.

In a device in accordance with embodiments of the present invention, the phase adjusting elements may be logically organized in logical rows and logical columns, such that each phase adjusting element can be uniquely identified by at least a column index and a row index.

In a device in accordance with embodiments of the present invention, each phase adjusting element may be directly connected to a pair of control lines of the plurality of control lines for connecting the phase adjusting element to a controller. The pair of control lines may comprise a column signal line and a row signal line. The column signal line and the row signal line may be connected to respectively phase adjusting elements forming a logical column and phase adjusting elements forming a logical row.

In a device in accordance with embodiments of the present invention, each phase adjusting element may comprise at least one transistor having a first terminal connected to the row signal line, a second terminal connected to the column signal line, and a third terminal connected to an electric storage.

In a device in accordance with embodiments of the present invention, the plurality of phase adjusting elements may be arranged in a cartesian grid pattern or in a polar grid pattern.

In a device in accordance with embodiments of the present invention, each phase adjusting element may be shaped as an arc of a circle, a sector of a circle or a segment of a circle.

In a device in accordance with embodiments of the present invention, each phase adjusting element may comprise an electrostatic phase adjusting element.

In a device in accordance with embodiments of the present invention, each electrostatic phase adjusting element may comprise an electrode. At least one of the control lines may be adapted for controlling an electric potential of the electrode.

In a device in accordance with embodiments of the present invention, the electrode may be cylindrical, toroidal or ring-shaped, embodiments not being limited thereto.

A device in accordance with embodiments of the present invention may comprise a first reference electrode and/or a second reference electrode forming respectively a plane above and/or a plane below the electrodes of the plurality of phase adjusting elements.

In a device in accordance with embodiments of the present invention, the first reference electrode and/or the second reference electrode may be perforated planar electrodes.

In a device in accordance with embodiments of the present invention, device, e.g. each electrostatic phase adjusting element, may comprise a reference electrode. The reference electrode or reference electrodes may be arranged coplanar with the plurality of electrodes. Of the electrostatic phase adjusting elements.

In a device in accordance with embodiments of the present invention, the first reference electrode and/or the second reference electrode and/or the reference electrode(s) may be supplied with a reference electric potential, e.g. electrically grounded.

A device in accordance with embodiments of the present invention may comprise an electrostatic mirror comprising a patterned array of electrodes forming the plurality of phase changing elements.

In a device in accordance with embodiments of the present invention, the electrostatic mirror may be a electrostatic grazing mirror.

In a device in accordance with embodiments of the present invention, the plurality of phase adjusting elements may comprise controllable magnetic elements, each controllable magnetic element being adapted for locally controlling a magnetic field to locally adjust the phase of the charged particle wave due to the Aharanov-Bohm effect.

A device in accordance with embodiments of the present invention, may comprise a controller connected to the plurality of control lines for controlling the local phase adjustment of the charged particle beam caused by each phase adjusting element individually.

In a device in accordance with embodiments of the present invention, the controller may comprise a processor for programming a spatial pattern of the spatial phase distribution and controlling the plurality of phase adjusting elements via the plurality of electric conductors to program the device accordingly.

In a second aspect, the present invention also relates to an electron microscopy apparatus comprising a device in accordance with embodiments of the first aspect of the present invention for locally manipulating a spatial phase distribution of a charged particle wave propagating along a beam axis of the electron microscopy apparatus when the target region is placed in the charged particle wave propagating along the beam axis.

In a third aspect, the present invention also relates to a method for locally manipulating a spatial phase distribution of a charged particle wave propagating along a beam axis. The method comprises providing a charged particle wave propagating along a beam axis, controlling a plurality of phase adjusting elements, e.g. organized in a two-dimensional array, such as to configure a phase for each phase adjustment element individually in accordance with a spatial pattern of the spatial phase distribution, and locally adjusting the phase of the charged particle wave by impinging the charged particle wave on the plurality of phase adjusting elements, e.g. transmitting the charged particle wave through the plurality of phase adjusting elements or reflecting the charged particle wave by the plurality of phase adjusting elements.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a device for locally manipulating a spatial phase distribution of a charged particle wave propagating along a beam axis. The device comprises a support element having a target region for receiving, e.g. transmitting and/or reflecting, the charged particle wave propagating along the beam axis and a plurality of phase adjusting elements supported by the support element and located in the target region for locally adjusting the phase of the charged particle wave when the charged particle wave impinges on the phase adjusting element, e.g. is transmitted through or near the phase adjusting element or reflects on or near the phase adjusting element. The device also comprises a plurality of control lines connected to the plurality of phase adjusting elements for individually controlling each phase adjusting element. The plurality of phase adjusting elements may be organized in a two-dimensional array. Furthermore, the plurality of phase adjusting elements may also be organized in a three-dimensional array, e.g. comprising a plurality of two-dimensional arrays stacked in a third dimension.

Figure 1:
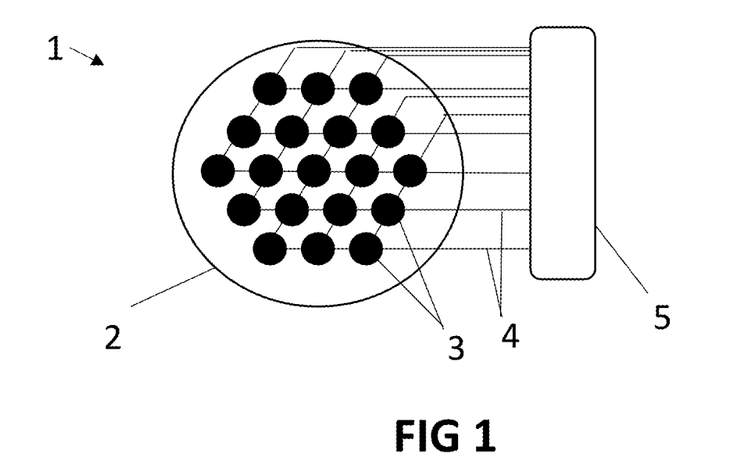
FIG. 1 shows a first view of a device in accordance with embodiments of the present invention.
Figure 2:
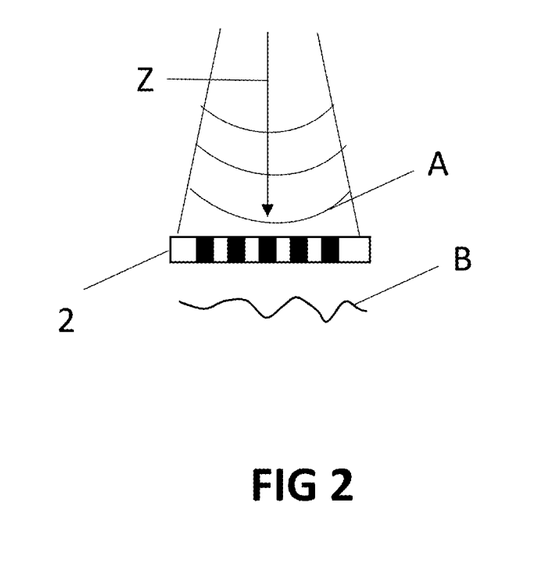
FIG. 2 shows a second view of a device in accordance with embodiments of the present invention.

Referring to FIG. 1 and FIG. 2, an exemplary device 1 in accordance with embodiments of the present invention is shown.

The device 1 is adapted for locally manipulating a spatial phase distribution of a charged particle wave propagating along a beam axis Z. The charged particle wave may be a coherent charged particle wave.

The charged particle wave may comprise an electron wave, or other charged particle wave, e.g. an ion or hadron particle wave.

Particularly, the device, in operation, may be suitable for manipulating the phase of the charged particle wave in accordance with a freely selectable and controllable spatial distribution, e.g. in a two-dimensional plane, e.g. freely selectable within boundaries and/or constraints due to design parameters, e.g. within phase shift resolution and/or range constraints and/or spatial resolution and/or range constraints imposed by the design.

For example, as schematically illustrated in FIG. 2, the device may change an initial spatial phase distribution of the charged particle wave, e.g. a spherical or planar wave, upon incidence on the device into an adjusted phase distribution. For example, a wavefront A incident on the device may be distorted in a controllable fashion by the device into an outgoing wavefront B.

The device 1 comprises a support element 2 having a target region for receiving the charged particle wave propagating along the beam axis Z and a plurality of phase adjusting elements 3 supported by the support element and located in the target region. Thus, the support element may comprise a substrate, a frame or similar mechanical support structure for mechanically supporting and positioning the phase adjusting elements relative to the beam axis Z.

For example, the support element 2 may comprise, be comprised in or attached to a vacuum contact holder for a charged beam apparatus, such as an electron microscopy apparatus.

The plurality of phase adjusting elements 3, e.g. each phase adjusting element 3, is adapted for locally adjusting the phase of the charged particle wave when, e.g. where, the charged particle wave impinges on the phase adjusting element, e.g. is transmitted through, or at least near, the phase adjusting element and/or is reflected by or near the phase adjusting element.

For example, the spatial phase distribution of a charged particle wave propagating along the beam axis may be adjusted by the plurality of phase adjusting elements 3, e.g. such as to obtain a configurable wavefront of interest, e.g. by interference and diffraction of the locally phase-shifted wave components.

The device also comprises a plurality of control lines 4, e.g. electric conductors, connected to the plurality of phase adjusting elements 3 for individually controlling, e.g. powering and controlling, each phase adjusting element, e.g. for supplying a control signal to each phase adjusting element to control the local phase adjustment of the charged particle wave by that phase adjusting element.

The plurality of phase adjusting elements 3 may be organized in a two-dimensional array. For example, the two-dimensional array may be oriented in a plane at an angle with respect to the beam axis Z in operation of the device. For example, the two-dimensional array may comprise a cartesian grid or other tiling of the target region.

However, embodiments of the present invention are not necessarily limited thereto, e.g. in a device in accordance with embodiments of the present invention, the phase adjusting elements may be logically and/or physically organized in a single row, e.g. the plurality of phase adjusting elements 3 may be organized in a one-dimensional array. For example, such one-dimensional array may be advantageously be used in an energy dispersive plane to tune the temporal behaviour of electron wavepackets. For example, the phase in the energy plane can decode for the temporal shape of a wavepacket, such that tuning this phase may be used to obtain extreme time resolution.

For a device operating generally in a transmission mode, the angle may be substantially perpendicular to the beam axis Z. For a device operating generally in a reflection mode, the angle may be in the range of 0° to 90°, e.g. for a device comprising electrostatic mirror elements.

For example, the phase adjusting elements 3 may be logically organized, or organizable, in logical rows and logical columns, e.g. such that each phase adjusting element can be identified by at least a column index and a row index. Such rows and columns need not necessarily correspond to cartesian coordinates, but may correspond to another coordinate system, for example a polar coordinate system.

Figure 11:
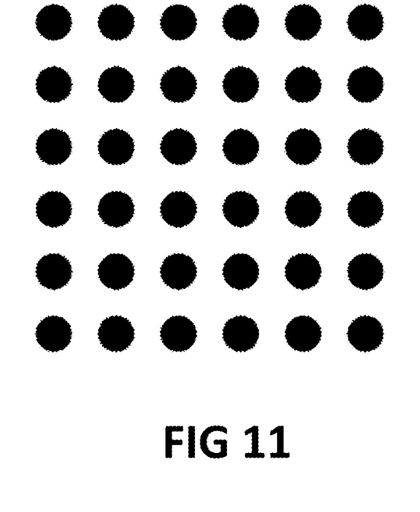
FIG. 11 illustrates an exemplary rectangular grid layout of phase adjusting elements in accordance with embodiments of the present invention.

For example, the two-dimensional array may form a cartesian grid of phase adjusting elements 3, e.g. as illustrated in FIG. 11. In other words, the phase adjusting elements 3 may be physically organized in physical rows and physical columns. For example, the number of rows may be at least two, preferably at least four, e.g. at least six, at least eight or at least ten. For example, the number of columns may be at least two, preferably at least four, e.g. at least six, at least eight or at least ten. The number of rows and the number of columns may be equal or at least similar in magnitude. Embodiments of the present invention do not exclude numbers of rows and/or columns that substantially exceed ten, even by one or more orders of magnitude, e.g. $1\times10^2$ or even $1\times10^3$. It shall also be understood that embodiments of the present invention may deviate from an archetypical cartesian grid in various ways, such as an irregular spacing of rows and/or columns, a different tiling (e.g. by offsetting the columns of consecutive rows with respect to each other), and/or by limiting the area covered by the grid to a non-rectangular boundary (e.g. a substantially circular or hexagonal boundary).

Figure 12:
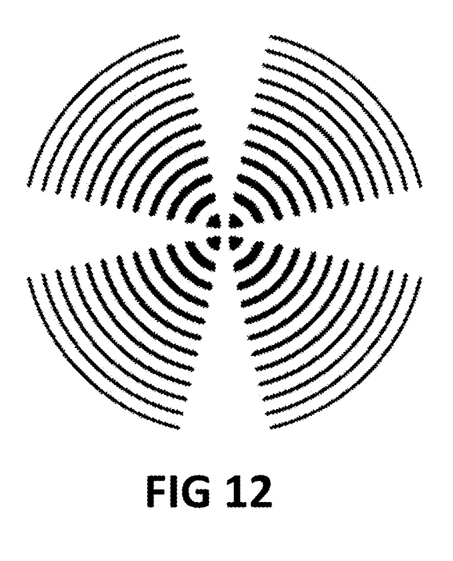
FIG. 12 illustrates a first exemplary polar grid layout of phase adjusting elements in accordance with embodiments of the present invention.
Figure 13:
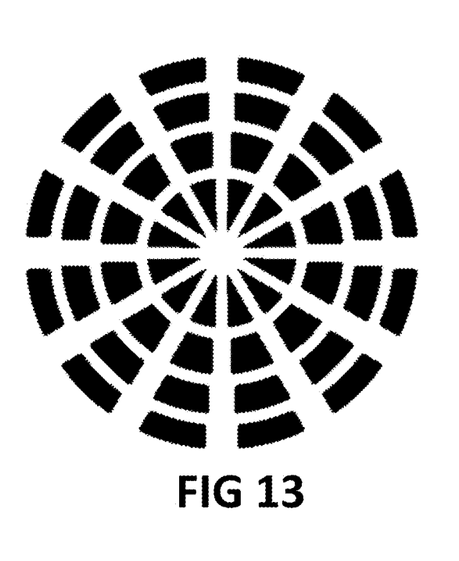
FIG. 13 illustrates a second exemplary polar grid layout of phase adjusting elements in accordance with embodiments of the present invention.

Referring to FIG. 12 and FIG. 13, the two-dimensional array may form a polar grid of phase adjusting elements 3. For example, (the center of) each phase adjusting element may correspond to a radial distance coordinate from a center and an angular coordinate (with respect to an arbitrary reference direction). Logical rows (or equivalently, logical columns) may correspond to different radial distances from the center and logical columns (respectively logical rows) may correspond to different angular coordinates. For example, the phase adjusting elements may be arranged in groups, in which the phase adjusting elements of each group substantially correspond to a radial distance that is specific for that group. The number of such groups may be at least two, preferably at least four, e.g. at least six, at least eight, at least ten or at least twelve. Likewise, in each radial group, the phase adjusting elements may correspond to a plurality of angular coordinates, e.g. at least two, preferably at least four, e.g. at least six, at least eight, at least ten or at least twelve. For example, FIG. 12 illustrates a configuration in which 12 radial coordinates and 4 angular coordinates are covered by the polar grid structure. FIG. 13 illustrates a configuration in which 4 radial coordinates and 12 angular coordinates are covered by the polar grid structure. Embodiments of the present invention do not exclude numbers of radially arranged rows and/or angularly arranged columns that substantially exceed ten, even by one or more orders of magnitude, e.g. $1\times10^2$ or even $1\times10^3$. It shall also be understood that embodiments of the present invention may deviate from an archetypical polar grid in various ways, such as an irregular spacing of rows and/or columns, a different (or equal) number of angular arcs or segments arranged in 'columns' for different radial 'rows' and/or a different tiling (e.g. by angularly offsetting the columns of consecutive rows with respect to each other).

Even though in various illustrative examples, the phase adjusting elements are depicted in the drawings as circular elements, it shall be clear to the skilled person that this is not limitative, and the shape and structure of the phase adjusting elements can vary across embodiments without diverting from the principles underlying the present invention. For example, the phase adjusting elements may be shaped as circular elements, rectangular elements, square elements, triangular elements, hexagonal elements, but also as arcs (e.g. of a circle), sectors (e.g. of a circle) or segments (e.g. of a circle). For example, phase adjusting elements shaped as arcs, segments and/or sectors may be particularly suitable for a polar grid arrangement such as illustrated in FIG. 12 and FIG. 13.

In embodiments of the present invention, each phase adjusting element 3 may be directly connected to a corresponding control line 4 for connecting the phase adjusting element directly to a controller 5. For example, referring to FIG. 4, a device 1 is shown in which each phase adjusting element 3 is electrically connected to a corresponding electric conductor 4.

In other embodiments of the present invention, each phase adjusting element 3 may be directly connected to a pair of control lines 4 for connecting the phase adjusting element to a controller 5. Such pair of electric conductors may comprise a column signal line and a row signal line, each connected to a (different) subset of the plurality of phase adjusting elements, e.g. to respectively phase adjusting elements forming a logical column and phase adjusting elements forming a logical row.

Figure 3:
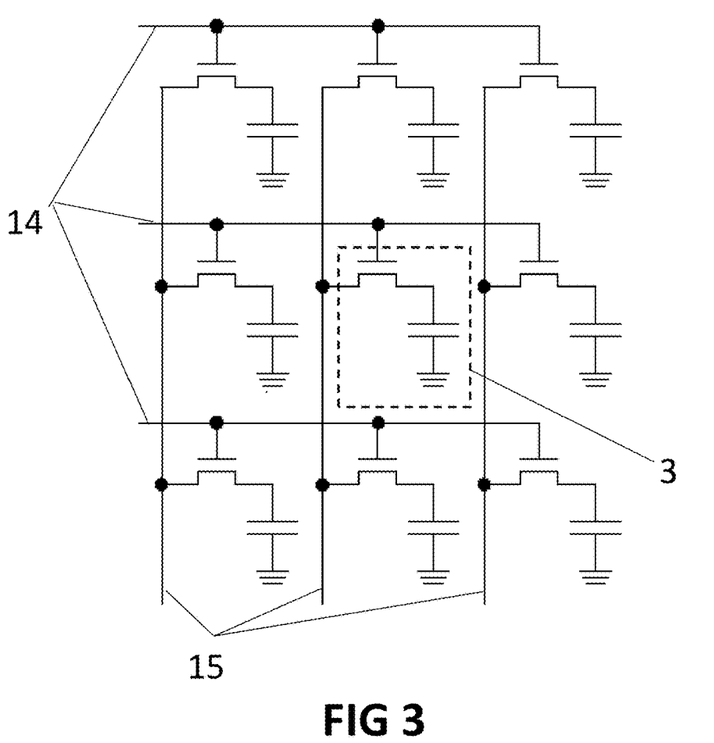
FIG. 3 schematically illustrates an addressing of elements in a device in accordance with embodiments of the present invention.

For example, referring to FIG. 3, the phase adjusting element 3 may comprise at least one transistor having a first terminal, e.g. a gate terminal, connected to a first electric conductor 4, e.g. a row signal line 14, a second terminal, e.g. a source or drain terminal, connected to a second electric conductor 4, e.g. a column signal line 15, and a third terminal, e.g. a drain or source terminal, connected to an electric storage, e.g. a capacitor. The capacitor may be connected to or formed by an electrode 11 and/or a further electrode(s) 12, as discussed further hereinbelow.

In another example, the at least one transistor may comprise a double-gate transistor, having a first terminal, e.g. a first gate terminal, connected to a first electric conductor 4, e.g. a row signal line, and a second terminal, e.g. a second gate terminal, connected to a second electric conductor 4, e.g. a column signal line. A third terminal, e.g. a source or drain terminal, may be connected to the electric storage, e.g. a capacitor. The capacitor may be connected to or formed by an electrode 11 and/or a further electrode(s) 12, as discussed further hereinbelow. A fourth terminal, e.g. a drain or source terminal, may be connected to a third electric conductor 4, e.g. a power supply line.

However, embodiments of the present invention are not limited to such addressing means, e.g. as known in the art of addressable electronic arrays, each phase adjusting element may comprise additional transistors and/or further connections to additional electric conductors, for example to implement reset means for resetting the array to a predetermined reference state, e.g. to a ground potential, and/or for supplying a supply voltage to maintain the selected phase state of the phase changing element in operation. For example, if the phase changing element requires a current in operation for effecting the selected phase adjustment, a current may be supplied via a supply line and the flow of this current may be controlled, e.g. via a further transistor, in accordance with a stored charge in the electric storage.

Each phase adjusting element 3 may comprise an electrostatic phase adjusting element, such as an einzellens. For example, referring to FIG. 4 and FIG. 5, each phase adjusting element may comprise an electrode 11, and at least one of the electric conductors 4 may be adapted for controlling an electric potential of the electrode 11, e.g. for supplying the electric potential directly or for indirectly controlling a supply of the electric potential. Thus, a controllable electrostatic potential in the vicinity of the electrode 11 may control a local phase shift of the charged particle wave. The electrode 11 may be cylindrical, toroidal or ring-shaped, e.g. such as to affect the phase of charged particles travelling through the opening defined by such shape, while advantageously also reducing absorption, reflection or scattering of the charged particles on the electrode. However, embodiments of the present invention are not necessarily limited to the abovementioned shapes. For example, the electrode 11 may be hexagonal, square, pie-shaped, circular-arc shaped, circular-segment shaped or have another shape.

Furthermore, each phase adjusting element may comprise a plurality of electrodes 11, each being adapted for being controlled individually via the electric conductors 4. Thus, multiple electrodes may connect to a single phase adjusting element to provide not only a controllable flat phase front but also a tilted phase front per element.

The device may comprise a first reference electrode 12 and/or a second reference electrode 13.

Figure 6:
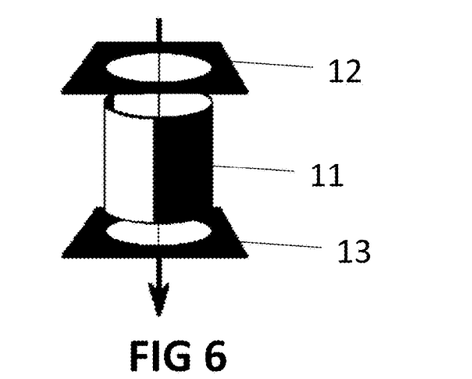
FIG. 6 illustrates an exemplary electrostatic phase adjusting element in a device in accordance with embodiments of the present invention.

The first reference electrode 12 and the second reference electrode 13 may form respectively a plane above and a plane below the electrodes 11 of the plurality of phase adjusting elements 3, with respect to the direction of the beam axis Z. For example, the first reference electrode 12 and/or the second reference electrode 13 may be supplied with a reference potential and/or respectively a first reference potential and a second reference potential. For example, the first reference electrode 12 and/or the second reference electrode 13 may be electrically grounded. The first and/or second reference electrode may be planar, although other shapes are also contemplated by the present disclosure. Referring to FIG. 6, the first and/or second reference electrode may be perforated, e.g. to reduce the absorption, scattering and/or reflection of charged particles incident on the reference electrode while maintaining a good uniformity of the electric potential over the surface defined by the electrode.

Alternatively, the device may comprise a reference electrode 12 or a plurality of reference electrodes 12, in which this first reference electrode(s) is arranged coplanar with the plurality of electrodes 11. For example, each phase adjusting element may comprise an electrode 11 and a reference electrode 12. For example, the reference electrode may be electrically grounded, or may be maintained at another predetermined reference electric potential.

For example, the reference electrode(s) 12 may be isolated from the electrodes 11 and may surround each electrode 11, e.g. over at least an angle of 270° around the electrode 11. For example, the reference electrode may form a ring, or similar structure have a topological hole, around the electrode 11.

Alternatively, the device may comprise a thin electrically insulating film, e.g. sufficiently thin to achieve a good transparency for the incident charged particle wave. The plurality of phase changing elements 3 may be adapted for spatially modulating a surface charge on the electrically insulating film, e.g. to generate a controllable, typically inhomogeneous, surface charge on the electrically insulating film.

Figure 8:
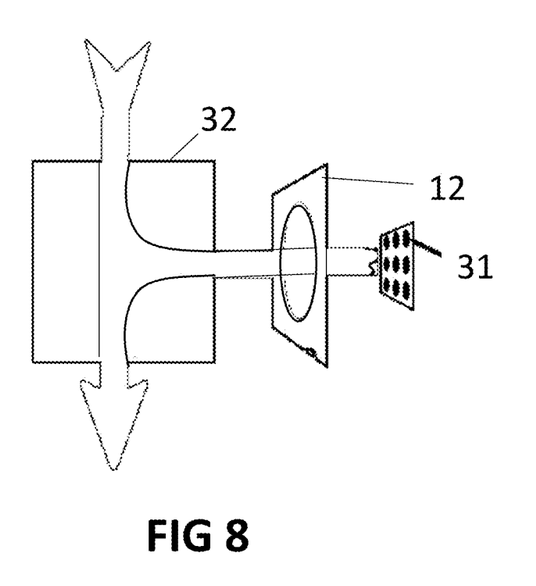
FIG. 8 illustrates exemplary electrostatic mirror phase adjusting elements in a device in accordance with embodiments of the present invention.
Figure 9:
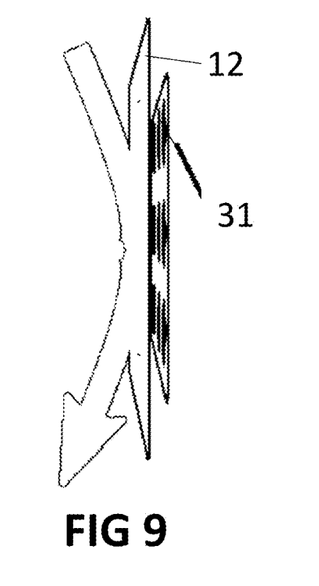
FIG. 9 illustrates exemplary electrostatic grazing mirror phase adjusting elements in a device in accordance with embodiments of the present invention.

Thus, the device may comprise an array of einzellenses. However, each phase adjusting element 3 may also comprise a different electrostatic phase adjusting element, such as an electrostatic mirror, e.g. as shown in FIG. 8 and FIG. 9, in which each phase adjusting element 3 comprise an electrode 31, e.g. forming a patterned array of electrodes. In such embodiments, the device may also comprise a prism 32, and a further reference electrode 12, e.g. an electrically grounded electrode 12. For example, the further reference electrode 12 may be arranged between the electrodes 11 and the prism 32, and the prism may be configured to direct an incident charged particle wave toward the further reference electrode 12 and the electrodes 11. Likewise, the prism may direct a reflected wave, reflected by the electrostatic mirror, to substantially continue propagating along the beam direction of the incident charged particle wave before it was redirected. The array of electrodes 11 may form a (virtual) deformable mirror plane.

The electrostatic mirror may be a grazing incidence mirror to advantageously reduce the high potential required for operating a conventional electrostatic charged particle optical mirror, e.g. as illustrated in FIG. 9.

Figure 10:
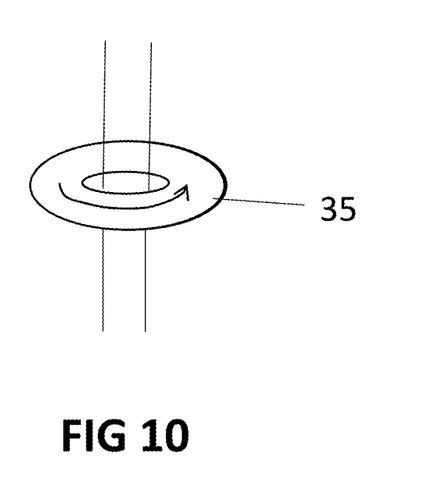
FIG. 10 illustrates an exemplary magnetic phase adjusting element in a device in accordance with embodiments of the present invention.

Alternatively or additionally, the plurality of phase adjusting elements 3 may comprise controllable magnetic elements. Each controllable magnetic element may be adapted for locally controlling a magnetic field to locally adjust the phase of the charged particle wave due to the Aharanov-Bohm effect. For example, such phase adjusting element may comprise a solenoid, e.g. a toroidal solenoid. Such phase adjusting element may comprise a magnetic material for storing a magnetic skyrmion, e.g. such as to form a skyrmion lattice. For example, the plurality of control lines 4 may comprise electric conductors for locally generating and/or changing a skyrmion state in the phase adjusting element, or may comprise a plurality of magnetic buses for controllably causing a skyrmion, e.g. generated in a skyrmion generator connected to the magnetic bus, to propagate to the phase adjusting element, where it can be stored in operation of the device. The phase adjusting element may comprise a magnetizable element for storing a magnetic vortex state, such as a ferromagnetic ring 35, e.g. as shown in FIG. 10.

The device 1 may also comprise a controller connected to the plurality of control lines for controlling the local phase adjustment of the charged particle beam caused by each phase adjusting element individually.

For example, the controller 5 may comprise an addressing unit for controlling the addressing of each phase adjusting element via the plurality of electric conductors. For example, such addressing unit may comprise a multiplexer and/or demultiplexer, e.g. as known in DRAM addressing.

The controller 5 may comprise a processor for programming a spatial pattern of the spatial phase distribution and controlling the plurality of phase adjusting elements via the plurality of electric conductors to program the device accordingly.

The controller may be adapted for receiving an input from a user to select and/or define the spatial pattern.

The controller 5 may comprise a simulator for simulating a spatial phase distribution of the charged particle wave after having interacted with the plurality of phase adjusting elements.

The controller 5 may be adapted for numerically optimizing and/or computing a plurality of settings for the plurality of phase adjusting elements to obtain or approximate a spatial phase distribution received as input from a user.

Furthermore, the controller 5 may be adapted for calculating a matched filter, e.g. for simulating a wave-sample interaction. For example, a quantum-mechanical (set of) equations may be solved modelling the interaction, e.g. the Schrödinger equation for a fast-electron and sample system. This calculating of a matched filter may comprise an iterative optimisation of a phase filter implemented by a configuration of the phase adjusting elements. For example, the matched filter may be conjugated to a feature of interest in the sample, such as a predetermined molecule of interest.

In a second aspect, the present invention relates to an electron microscopy apparatus comprising a device in accordance with embodiments of the first aspect of the present invention for locally manipulating a spatial phase distribution of an electron wave propagating along a beam axis Z of the electron microscopy apparatus when the target region is placed in the electron wave propagating along the beam axis Z.

For example, the electron microscopy apparatus may comprise a transmission electron microscope, a scanning electron microscope and/or a low-energy electron microscope.

The device in accordance with embodiments of the first aspect of the present invention may be placed in a back focal plane of an objective lens of the apparatus and/or in a front focal plane of the apparatus, e.g. in a condenser plane of the apparatus.

It is an advantage of embodiments that programmable and/or dynamic electron beam shaping can be achieved, e.g. providing a versatile and fast way to tune the wave state of the electron beam. For example, the tedious production of static holographic phase plates can be avoided. Furthermore, the insertion of phase plates or other elements that can be replaced by a device in accordance with embodiments, e.g. in a TEM apparatus, may typically cause a significant downtime that can be avoided by a programmable device in accordance with embodiments. Furthermore, such conventional holographic masks or other static phase adjustment means may typically exclude any iterative optimisation of the shaped electron beam and thus restricts research and applications to hero-experiments and one-of-a-kind realisations.

The device in accordance with embodiments of the first aspect of the present invention may be used as a versatile replacement of a conventional phase plate, e.g. in a retrofit of an apparatus, e.g. to expand the capabilities of such scanning or transmission electron microscope.

Figure 14:
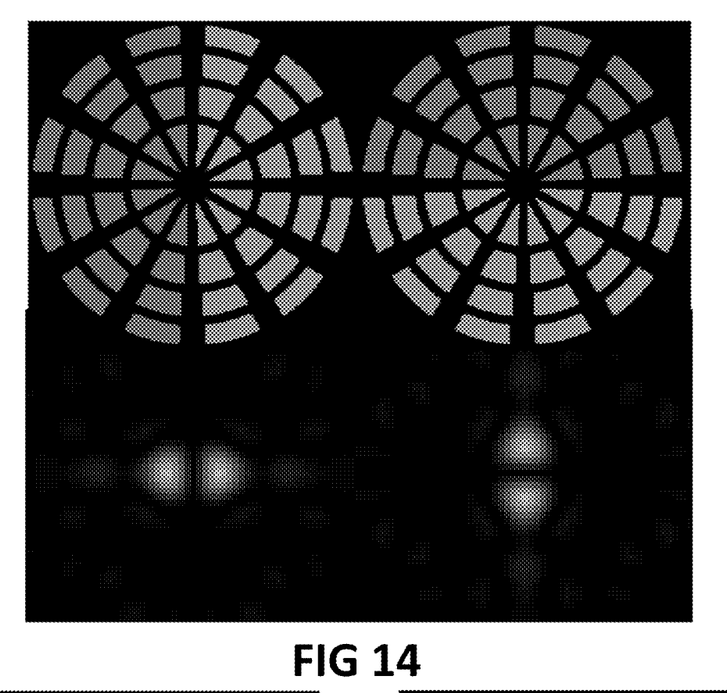
FIG. 14 shows two dynamically configurable settings of a device in accordance with embodiments of the present invention for shaping an electron beam such as to implement a half-wave phase plate.
Figure 15:
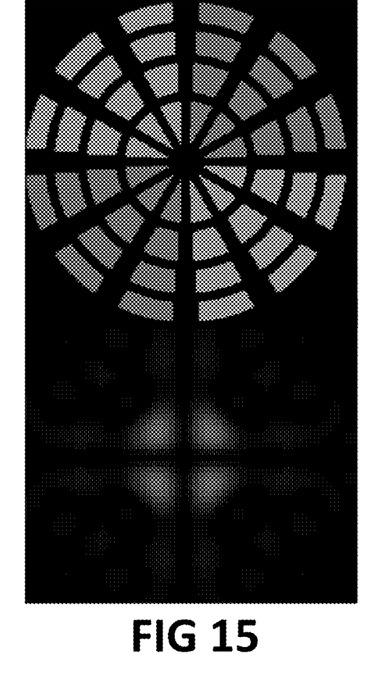
FIG. 15 shows a dynamically configurable setting of a device in accordance with embodiments of the present invention for shaping an electron beam such as to implement a quarter-wave phase plate.
Figure 16:
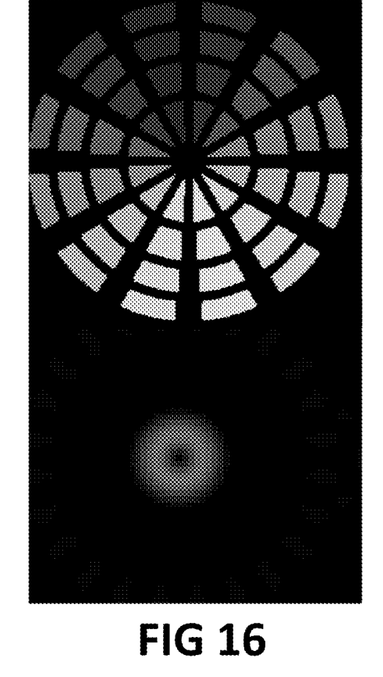
FIG. 16 shows a dynamically configurable setting of a device in accordance with embodiments of the present invention for shaping an electron beam such as to generate a vortex wave beam.
Figure 17:
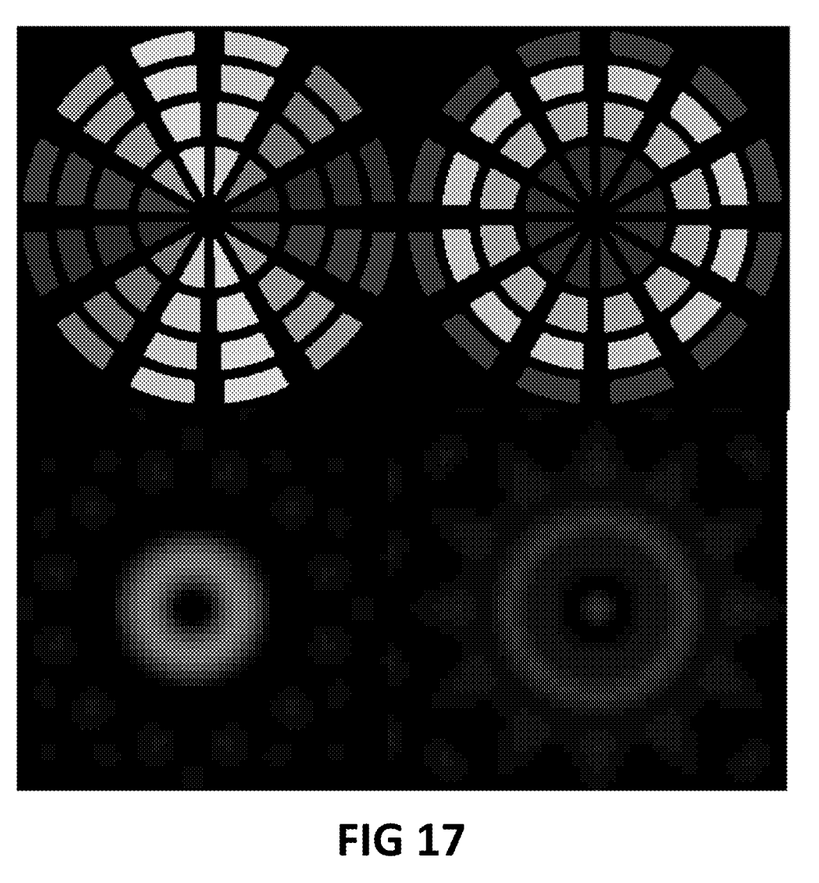
FIG. 17 shows two further exemplary dynamically configurable settings of a device in accordance with embodiments of the present invention.

For example, FIG. 14 shows two configurations, e.g. dynamically configurable configurations, of a device in accordance with embodiments of the present invention comprising electrostatic phase adjusting elements arranged as shown in FIG. 13, for shaping an electron beam, cf. the beam profiles shown below in FIG. 14, such as to implement a half-wave phase plate. Likewise, FIG. 15 shows a configuration and corresponding beam profile for implementing a quarter-wave phase plate. FIG. 16 shows a configuration and corresponding beam profile for implementing a vortex wave phase plate. FIG. 17 shows two further examples of dynamic configurable settings of such device for generating non-trivial beam profiles, as also depicted.

The device in accordance with embodiments of the first aspect of the present invention may form an (or a part of an) aberration corrector in an electron microscope.

In transmission electron microscopy, more information may be obtainable by less electrons and a fast and efficient tunability can be achieved, e.g. reducing beam damage, improving contrast and/or resolution, improving throughput and improving repeatability. Furthermore, a cheap and compact instrument can be achieved.

In scanning electron microscopy, a high spatial resolution can be achieved, e.g. by obtaining a beam that is close to the diffraction limit at a low cost.

In a third aspect, the present invention relates to a method for locally manipulating a spatial phase distribution of a charged particle wave propagating along a beam axis Z, for example in a charged particle beam apparatus, such as an electron microscopy apparatus. The method comprises providing the charged particle wave propagating along the beam axis Z, e.g. using a particle accelerator, e.g. an electron gun. The method comprises controlling a plurality of phase adjusting elements 3, e.g. organized in a two-dimensional array, such as to configure a phase for each phase adjustment element individually in accordance with a spatial pattern of the spatial phase distribution. The method also comprises locally adjusting the phase of the charged particle wave by impinging the charged particle wave on the plurality of phase adjusting elements 3.

The method may comprise operating, e.g. using, a device in accordance with embodiments of the first aspect of the present invention.

The method may be performed in an apparatus in accordance with embodiments of the second aspect of the present invention.

Further features of a method in accordance with the present invention will be clear from the description of a device and/or apparatus in accordance with embodiments as described hereinabove.

Figure 4:
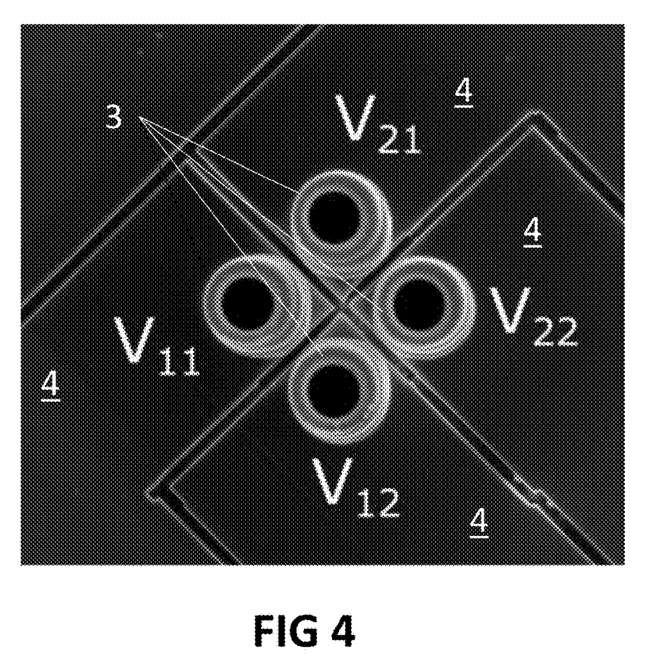
FIG. 4 shows a photograph of a device in accordance with embodiments of the present invention.
Figure 5:
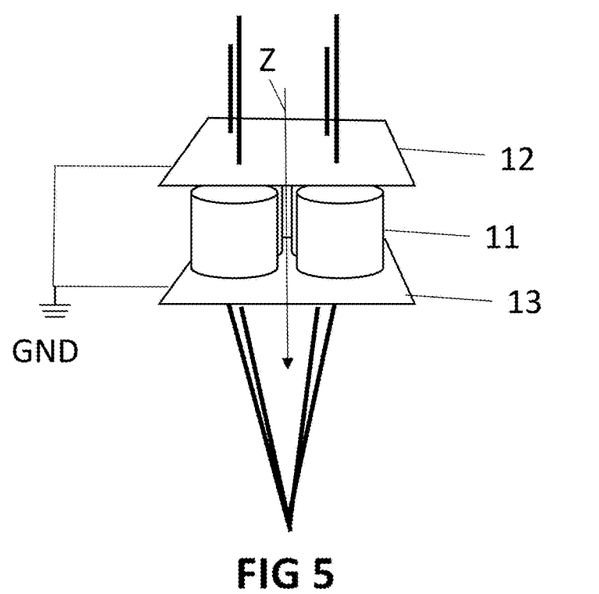
FIG. 5 illustrates exemplary electrostatic phase adjusting elements in a device in accordance with embodiments of the present invention.
Figure 7:
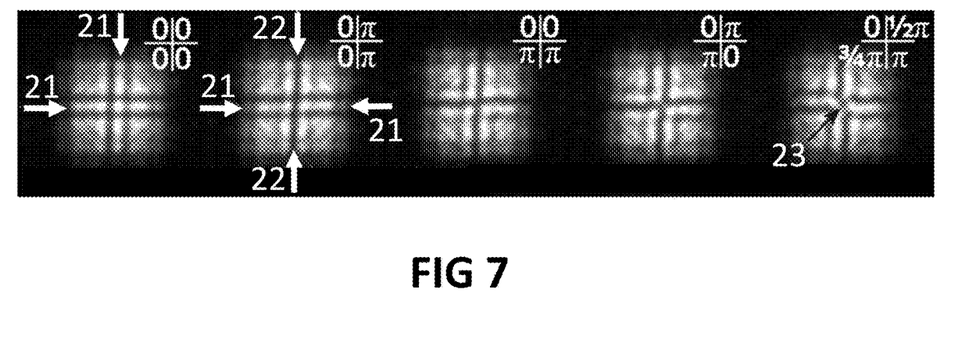
FIG. 7 illustrates phase distribution configurations obtainable by embodiments of the present invention.

FIG. 7 illustrates exemplary spatial phase distributions achievable by embodiments in of the present invention. This example relates to a 2×2 array of einzel lenses, e.g. as shown in the picture of FIG. 4. The exemplary device was manufactured on a chip patterned by ion beam milling, e.g. to form a 2×2 element grid. Methods of manufacture are not limited thereto, e.g. other lithography techniques and/or other CMOS and/or MEMS processing techniques may be used to manufacture such device.

In present example, it is demonstrated that the phase can be programmed by producing dipole, quadrupole and vortex fields in a tuneable 4-slit configuration.

For example, constructive interference 21 and destructive interference 22 is observed in accordance with the programmed configuration (as shown by the inset phase references $0,0,0,0$; $0,\pi,0,\pi$; $0,0,\pi,\pi$; $0,\pi,\pi,0$ and $0,1/2.\pi,3/4.\pi,\pi$) of the phase adjusting elements. It is also demonstrated that a vortex singularity can be created by even a simple 2×2 grid of phase adjusting elements.

The invention claimed is:

1. A device for locally manipulating a spatial phase distribution of a charged particle wave propagating along a beam axis, the device comprising:
   a support element having a target region for receiving the charged particle wave propagating along the beam axis,
   a plurality of phase adjusting elements, supported by the support element and located in the target region, for locally adjusting the phase of the charged particle wave when said charged particle wave is impinging on the phase adjusting element, and
   a plurality of control lines connected to the plurality of phase adjusting elements for individually controlling each phase adjusting element.

2. The device according to claim 1, wherein said plurality of phase adjusting elements is organized in a two-dimensional array.

3. The device according to claim 1, wherein each phase adjusting element is directly connected to a corresponding control line for connecting the phase adjusting element directly to a controller.

4. The device according to claim 1, wherein said phase adjusting elements are logically organized in logical rows and logical columns, such that each phase adjusting element can be uniquely identified by at least a column index and a row index.

5. The device according to claim 4, wherein each phase adjusting element is directly connected to a pair of control lines of the plurality of control lines for connecting the phase adjusting element to a controller, the pair of control lines comprising a column signal line and a row signal line, the column signal line and the row signal line being connected to respectively phase adjusting elements forming a logical column and phase adjusting elements forming a logical row.

6. The device according to claim 5, wherein said phase adjusting element comprises at least one transistor having a first terminal connected to the row signal line, a second terminal connected to the column signal line, and a third terminal connected to an electric storage.

7. The device according to claim 1, wherein said plurality of phase adjusting elements are arranged in a cartesian grid pattern or in a polar grid pattern.

8. The device according to claim 1, wherein each phase adjusting element is shaped as an arc of a circle, a sector of a circle or a segment of a circle.

9. The device according to claim 1, wherein each phase adjusting element comprises an electrostatic phase adjusting element.

10. The device according to claim 9, wherein said electrostatic phase adjusting element comprises an electrode, and
wherein at least one of the control lines is adapted for controlling an electric potential of the electrode.

11. The device according to claim 10, wherein said electrode is cylindrical, toroidal or ring-shaped.

12. The device according to claim 9, comprising a first reference electrode and/or a second reference electrode forming respectively a plane above and/or a plane below the electrodes of the plurality of phase adjusting elements,
wherein said first reference electrode and/or said second reference electrode are supplied with a reference electric potential.

13. The device according to claim 9, wherein said device comprises an electrostatic mirror comprising a patterned array of electrodes forming the plurality of phase changing elements.

14. The device according to claim 1, wherein said plurality of phase adjusting elements comprises controllable magnetic elements, each controllable magnetic element being configured for locally controlling a magnetic field to locally adjust the phase of the charged particle wave due to the Aharanov-Bohm effect.

15. The device according to claim 1, comprising a controller connected to the plurality of control lines, the controller being configured for controlling the local phase adjustment of the charged particle beam caused by each phase adjusting element individually.

16. The device according to claim 15, wherein said controller comprises a processor configured for programming a spatial pattern of the spatial phase distribution and controlling the plurality of phase adjusting elements via the plurality of electric conductors to program the device accordingly.

17. An electron microscopy apparatus comprising a device in accordance with claim 1 configured for locally manipulating a spatial phase distribution of a charged particle wave propagating along a beam axis of the electron microscopy apparatus when said target region is placed in the charged particle wave propagating along the beam axis.

18. A method for locally manipulating a spatial phase distribution of a charged particle wave propagating along a beam axis, the method comprising:
providing a charged particle wave propagating along a beam axis;
controlling a plurality of phase adjusting elements, such as to configure a phase for each phase adjustment element individually in accordance with a spatial pattern of the spatial phase distribution, and
locally adjusting the phase of the charged particle wave by transmitting the charged particle wave through the plurality of phase adjusting elements.

19. The method according to claim 18, wherein said plurality of phase adjusting elements are organized in a two-dimensional array.

* * * * *